US 9,466,526 B2

(12) United States Patent
Yeh

(10) Patent No.: US 9,466,526 B2
(45) Date of Patent: Oct. 11, 2016

(54) METAL TRENCH DECOUPLING CAPACITOR STRUCTURE PENETRATING THROUGH A SHALLOW TRENCH ISOLATION

(71) Applicant: Realtek Semiconductor Corp., HsinChu (TW)

(72) Inventor: Ta-Hsun Yeh, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 14/453,625

(22) Filed: Aug. 7, 2014

(65) Prior Publication Data

US 2015/0061075 A1   Mar. 5, 2015

(30) Foreign Application Priority Data

Sep. 3, 2013   (TW) .............. 102131715 A

(51) Int. Cl.
| | |
|---|---|
| H01L 29/66 | (2006.01) |
| H01L 21/768 | (2006.01) |
| H01L 21/762 | (2006.01) |
| H01L 27/06 | (2006.01) |
| H01L 29/94 | (2006.01) |

(52) U.S. Cl.
CPC ... *H01L 21/76877* (2013.01); *H01L 21/76224* (2013.01); *H01L 27/0629* (2013.01); *H01L 29/66181* (2013.01); *H01L 29/945* (2013.01)

(58) Field of Classification Search
None
See application file for complete search history.

(56) References Cited

U.S. PATENT DOCUMENTS

| | | | |
|---|---|---|---|
| 5,304,506 A | 4/1994 | Porter | |
| 6,072,740 A * | 6/2000 | Borkar ................. | G11C 5/005 365/206 |
| 6,492,244 B1 * | 12/2002 | Christensen ........ | H01L 27/1203 257/E21.563 |
| 7,033,882 B2 | 4/2006 | Block | |
| 7,816,762 B2 | 10/2010 | Chinthakindi | |
| 7,872,329 B2 * | 1/2011 | Sanada .................. | H01L 28/82 257/301 |
| 8,609,486 B1 * | 12/2013 | Smeys et al. ................ 438/243 | |
| 8,803,322 B2 * | 8/2014 | Yang ................ | H01L 21/76898 257/686 |
| 2004/0038492 A1 * | 2/2004 | Okazaki ............... | H01L 27/105 438/391 |
| 2004/0085120 A1 * | 5/2004 | Pitts ..................... | H01L 23/525 327/525 |
| 2004/0108587 A1 * | 6/2004 | Chudzik ................ | H01L 23/50 257/700 |
| 2006/0124982 A1 * | 6/2006 | Ho et al. ....................... 257/304 | |
| 2007/0035030 A1 * | 2/2007 | Horton ............. | H01L 23/49822 257/773 |
| 2008/0173977 A1 | 7/2008 | Chinthakindi | |
| 2011/0169131 A1 * | 7/2011 | Nakos ............... | H01L 29/66181 257/532 |
| 2013/0147057 A1 * | 6/2013 | Horng ................... | H01L 23/481 257/774 |
| 2013/0277854 A1 * | 10/2013 | Wong ................ | H01L 21/76898 257/774 |
| 2014/0327109 A1 * | 11/2014 | Weng ............... | H01L 29/66181 257/534 |
| 2015/0001675 A1 * | 1/2015 | Chang ................ | H01L 27/0811 257/532 |
| 2015/0061083 A1 * | 3/2015 | Yeh ................... | H01L 21/76898 257/621 |
| 2015/0092472 A1 * | 4/2015 | Yi ...................... | H01L 27/2463 365/148 |
| 2015/0340380 A1 * | 11/2015 | Flachowsky ...... | H01L 29/66181 257/195 |

FOREIGN PATENT DOCUMENTS

| | | |
|---|---|---|
| CN | 101226898 A | 7/2008 |
| CN | 101286519 | * 10/2008 |

* cited by examiner

*Primary Examiner* — Marc Armand
*Assistant Examiner* — Younes Boulghassoul
(74) *Attorney, Agent, or Firm* — Winston Hsu; Scott Margo

(57) ABSTRACT

A metal trench de-coupling capacitor structure includes a vertical trench disposed in a substrate, an insulating layer deposited on the sidewall of the vertical trench, an interlayer dielectric layer covering the substrate and the insulating layer, and a metal layer penetrating the interlayer dielectric layer to fill up the vertical trench. The metal layer is electrically connected to a power source.

10 Claims, 10 Drawing Sheets

METAL TRENCH DECOUPLING CAPACITOR STRUCTURE PENETRATING THROUGH A SHALLOW TRENCH ISOLATION

CROSS REFERENCE TO RELATED APPLICATION

This application claims the benefit of Taiwanese Application 102131715, filed Sep. 3, 2013.

BACKGROUND OF THE INVENTION

1. Field of the Invention

The present invention generally relates to a metal trench de-coupling capacitor structure. In particular, the present invention is directed to a deep metal trench de-coupling capacitor structure, to avoid the interference of power noise.

2. Description of the Prior Art

Generally speaking, as shown in FIG. 10, semiconductor elements 40 are usually various semiconductor elements 40 disposed on the element region 41 of the substrate 10. Optionally, the element region 41 may include various electronic elements. For example, various adjacent element regions 41 include electronic elements generating different types of signals. For instance, various adjacent element regions 41 may be a digital circuit element region 42, a radio frequency (RF) circuit element region 43, or an analog circuit element region 44. Because element regions 41 of different functions generate different types of signals, these signals may couple one another by means of common power, or become the noise of other signals.

Generally speaking, element regions 41 of different functions tolerate noise differently. For example, a digital circuit element region 42 generates digital signals. On one hand, the quality of a digital signal is indifferent to a considerable amount of noise which the digital signal itself carries. On the other hand, either a pure digital signal itself or its associated noise is likely to become the noise of other kinds of more sensitive signal types. Relatively speaking, a digital circuit element region 42 carries more noise than other element regions. In other words, the digital signal itself is indifferent to noise, but it could be the source of noise to other types of signals which are more sensitive to noise. In short, different element regions may tolerate power noise differently.

Because the power domains are increasing and the operational frequencies are increasing as well, they make power noise stronger and stronger because the sudden change of the electric current generates voltage pulse caused by the inductive behaviors of metal wires. Therefore, a new way is still needed to minimize as much as possible or to even eliminate the influence of power noise on different element regions. Preferably, it is also compatible with the current semiconductor manufacturing process.

SUMMARY OF THE INVENTION

In view of this, the present invention therefore proposes a metal trench de-coupling capacitor structure to avoid the interference of power noise. The metal trench de-coupling capacitor structure of the present invention has metal piles deeply rooted in the substrate and electrically connected to the power, to suppress power noise.

The present invention in a first aspect proposes a metal trench de-coupling capacitor structure. The metal trench de-coupling capacitor structure includes a substrate, a vertical trench, an insulating layer and an inter-metal connection layer. The vertical trench is disposed in the substrate. The insulating layer is disposed on the sidewall of the vertical trench. The inter-metal connection layer is disposed on the substrate and fills up the vertical trench. The inter-metal connection layer is electrically connected to a power.

In one embodiment of the present invention, the metal trench de-coupling capacitor structure further includes an inter-metal dielectric layer. The inter-metal dielectric layer is disposed on the interlayer dielectric layer to cover the interlayer dielectric layer. The inter-metal connection layer is disposed in the inter-metal dielectric layer and penetrates the interlayer dielectric layer.

The present invention in a second aspect proposes a method of a metal trench de-coupling capacitor structure. First, a substrate which is covered by an interlayer dielectric layer is provided. Second, a dual damascene process is carried out. A damascene opening and a vertical trench are accordingly formed so that the damascene opening is disposed in the interlayer dielectric layer and the vertical trench penetrates the interlayer dielectric layer and goes into the substrate. Then, an insulating layer is formed on the inner wall of the vertical trench. Later, the damascene opening and the vertical trench are simultaneously filled up with a metal so that the damascene opening becomes a dual damascene structure, and the vertical trench turns into a metal trench de-coupling capacitor structure.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a metal trench de-coupling capacitor structure and a method for forming the metal trench de-coupling capacitor structure. The inter-metal connection layer in the metal trench de-coupling capacitor structure goes deeply in the substrate to form a de-coupling capacitor structure along with the substrate and the insulating layer. The inter-metal connection layer is electrically connected to a power source. The metal trench de-coupling capacitor structure is able to decrease the abnormal voltage pulse and the power noise.

Figure 1:
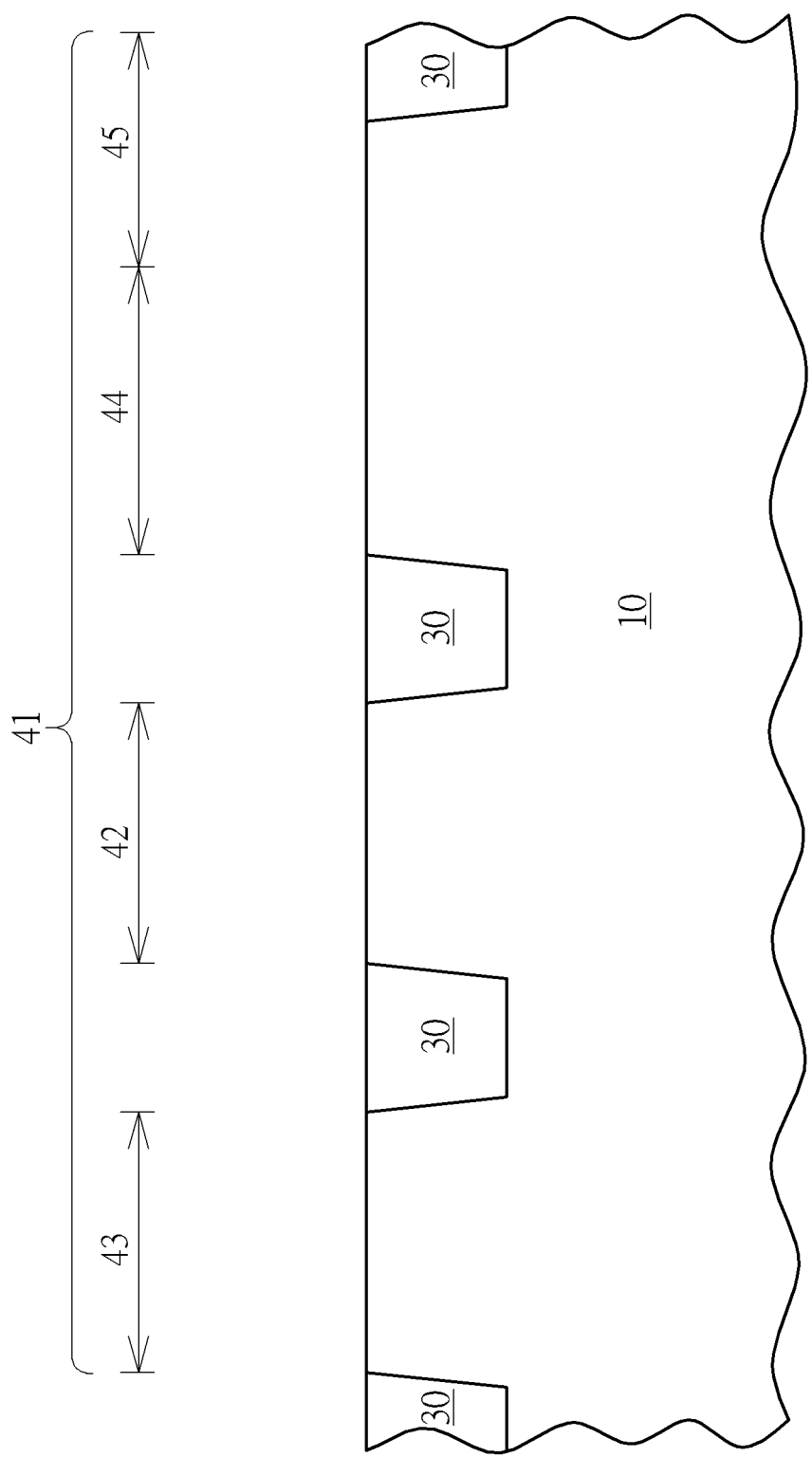
FIG. 1 to FIG. 7 illustrates the method for forming a metal trench de-coupling capacitor structure of the present invention.

First, the present invention provides a method of forming a metal trench de-coupling capacitor structure. FIG. 1 to FIG. 7 illustrate the method for forming a metal trench de-coupling capacitor structure of the present invention. First, as shown in FIG. 1, a substrate 10 is provided. The substrate may be a semiconductor substrate, for example a silicon substrate, an epitaxial silicon substrate, a silicon germanium substrate, a silicon carbide substrate or a silicon-on-insulator (SOI) substrate, but it is not limited to this. The substrate 10 is usually grounded. In addition, in the substrate 10 there may be several pre-formed shallow trench isolations 30 use as an electric isolation. The shallow trench isolations 30 are used to segregate semiconductor elements 40 which are adjacent to one another. The shallow trench isolations 30 may be formed as follows. First, some vertical trenches (not shown) for use in shallow trench isolations are formed by etching the substrate 10 with the help of a hard mask (not shown). Then, the previously formed vertical trenches are filed with an insulating material (not shown), and the excess insulating material is removed by a planarization process. The resultant shallow trench isolations 30 are obtained when the hard mask (not shown) is removed.

Figure 2:
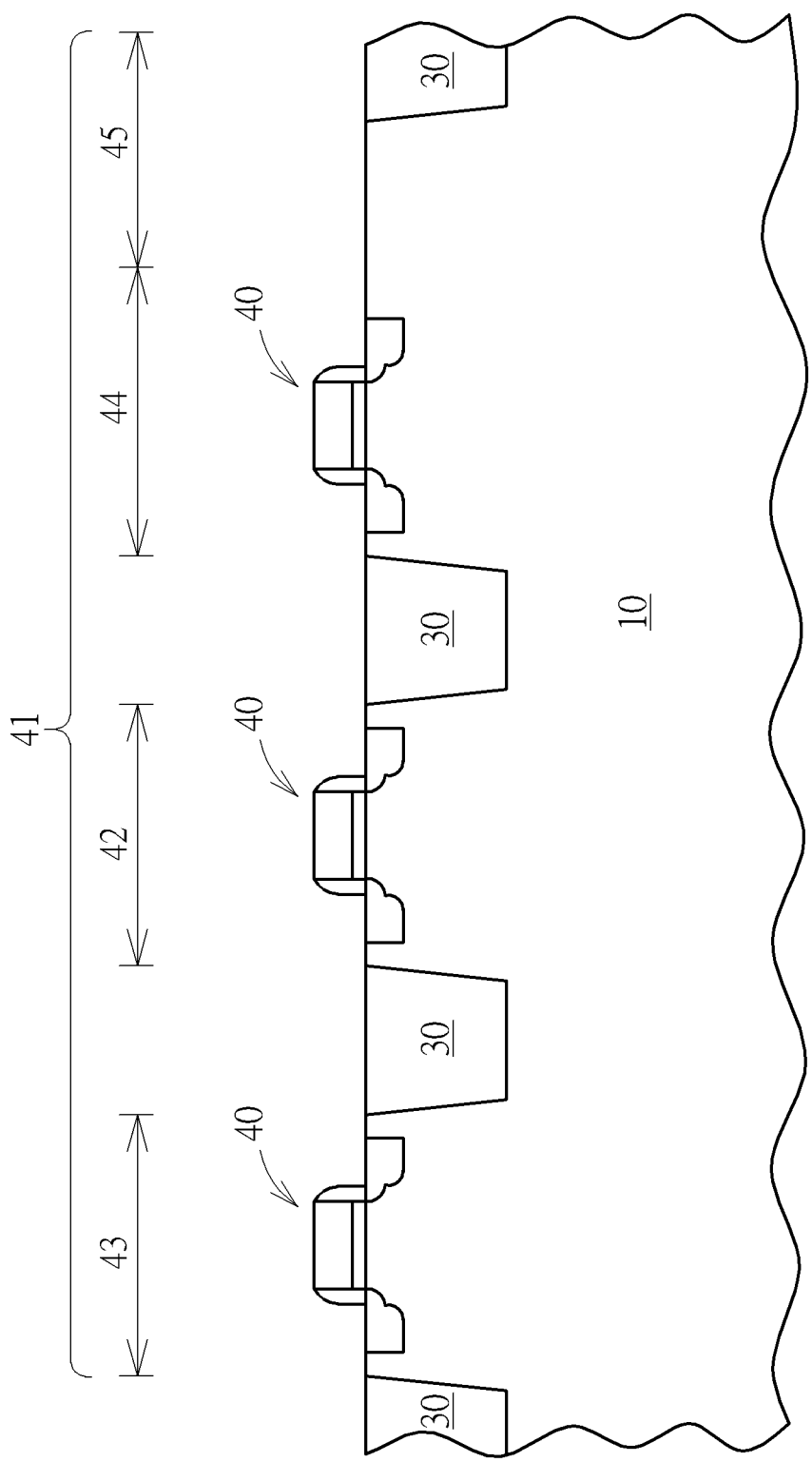

Then, as shown in FIG. 2, after the shallow trench isolation 30 in the substrate 10 is completed, optional semiconductor elements 40 are formed in the substrate 10. The semiconductor element 40 usually has a source (not shown), a drain (not shown) and a gate (not shown). The semiconductor elements 40 are usually various semiconductor elements 40 disposed in different element regions 41. Optionally, the element regions 41 include various electronic elements; preferably, different element regions 41 include electronic elements which generate different types of signals. For example, different element regions 41 may be a digital circuit element region 42, a RF circuit element region 43, an analog circuit element region 44 or a dummy element region 45.

Figure 3:
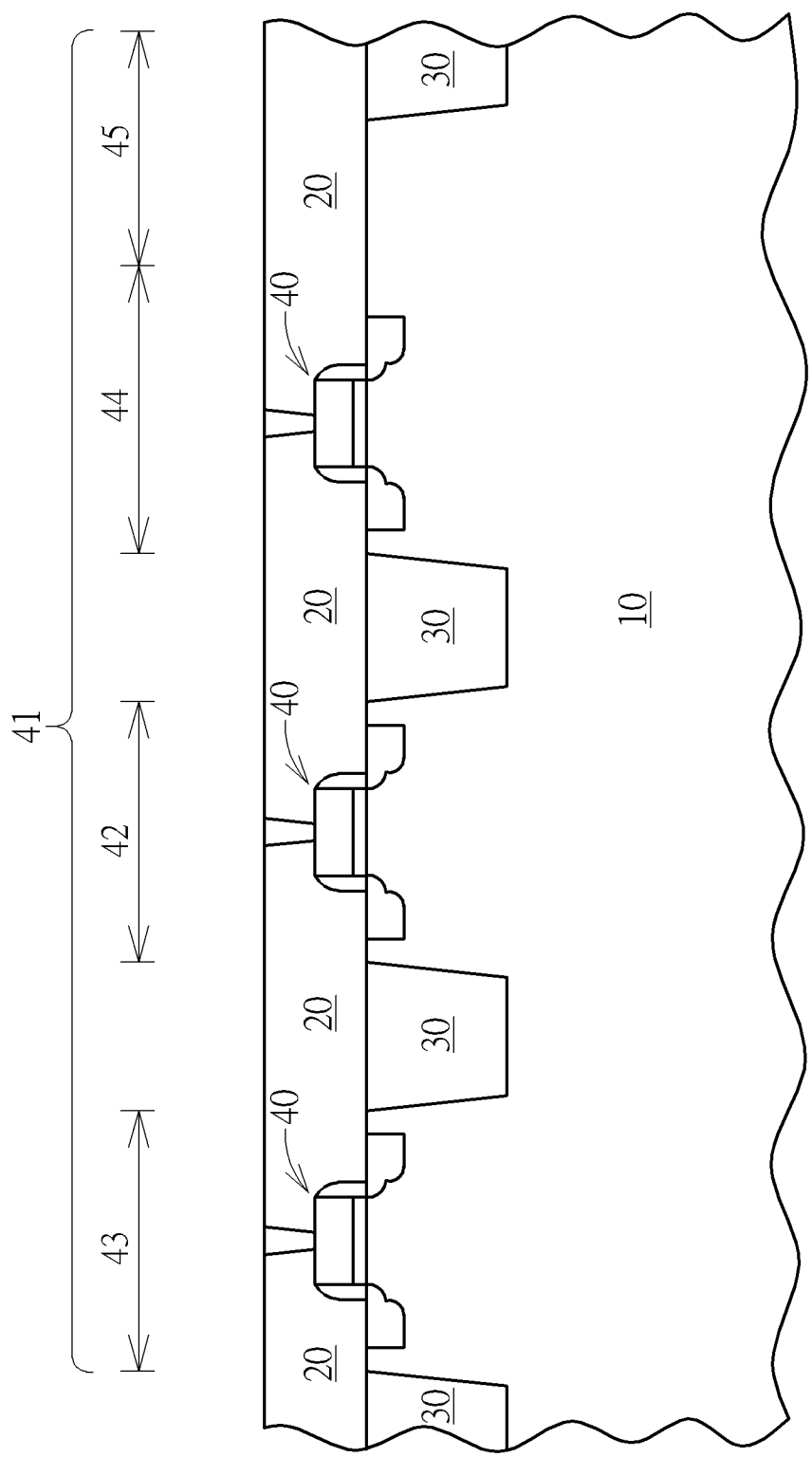

Then, after the completion of semiconductor elements 40 in different element regions 41, as shown in FIG. 3, an interlayer dielectric layer 20 is used to cover the substrate 10 and the finished semiconductor elements 40 so that the substrate 10 becomes a substrate 10 to be covered by an interlayer dielectric layer 20. The interlayer dielectric layer 20 is usually an insulating material, such as a silicon-oxide-containing insulating material (for example, USG or FSG).

Figure 4:
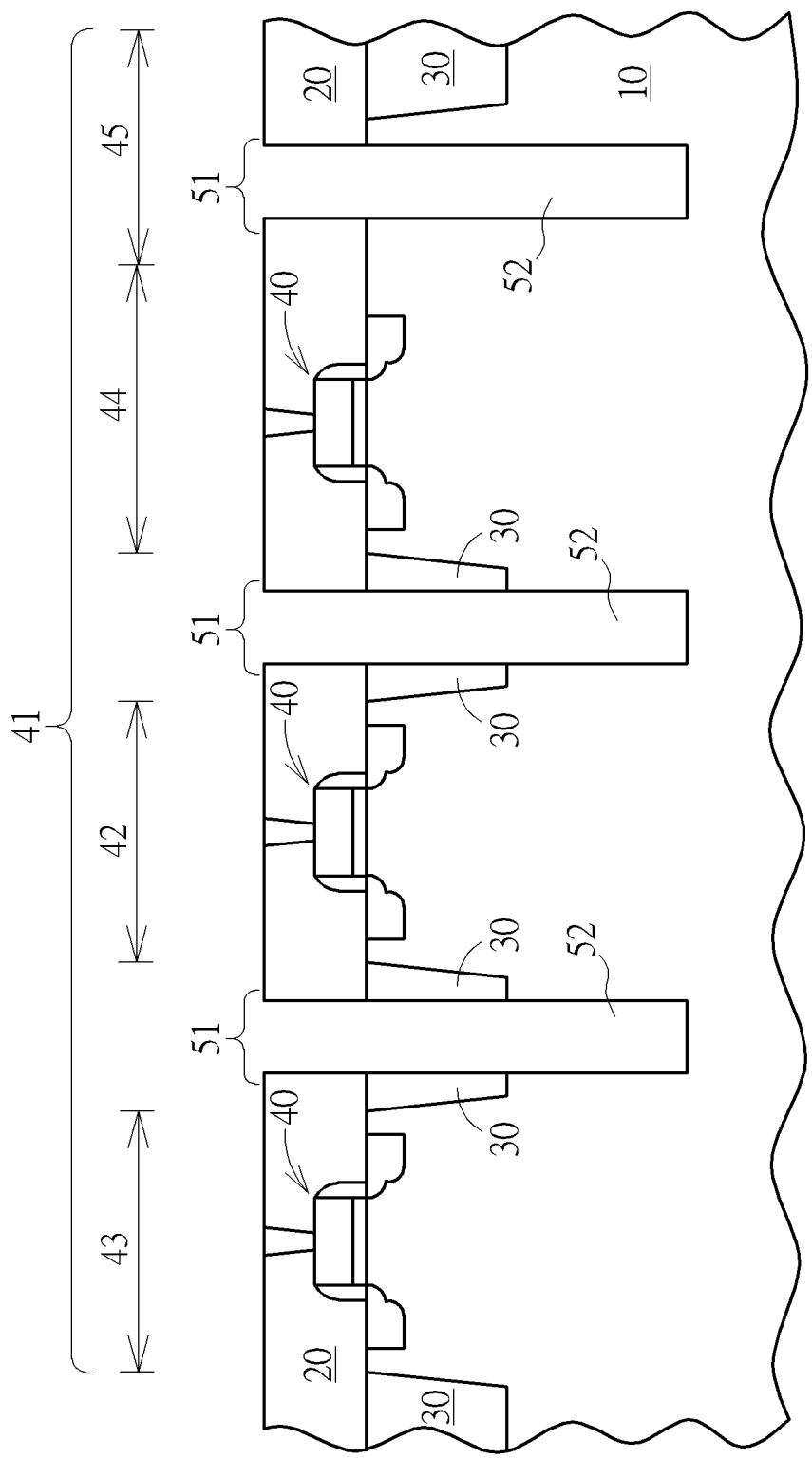

Next, as shown in FIG. 4, a damascene process is carried out in the interlayer dielectric layer 20 and in the substrate 10. This damascene process forms metal piles which go deeply in the substrate 10 to form a larger de-coupling capacitor to effectively decrease abnormal voltage pulse and power noise. First, as shown in FIG. 4, the needed damascene opening 51 and the vertical trench 52 are formed so that the damascene opening 51 is disposed above the interlayer dielectric layer 20 and above the substrate 10. The vertical trench 52 penetrates the interlayer dielectric layer 20 and goes into the substrate 10. Conventional procedures may be used to form the damascene opening 51 and the vertical trench 52. For example, a photoresist (not shown) along with a lithography and an etching process may be used to form a damascene opening 51 and a vertical trench 52.

Preferably, the vertical trench 52 in substrate 10 is as deep as possible. In one embodiment of the present invention, the vertical trench 52 is deeper than at least one semiconductor element 40 in the element region 41 and the shallow trench isolation 30. For example, the vertical trench 52 is deeper than any of the semiconductor element 40 in the element region 41. Or, the depth of the vertical trench is at least greater than 5 µm. Preferably, the depth of the vertical trench may be about 30 µm-100 µm. In addition, the width of the vertical trench 52 may be about 3 µm-10 µm. Generally speaking, the depth of the vertical trench 52 is dependent upon the width of the vertical trench 52. For example, the larger the width of the vertical trench 52 is, the deeper of the vertical trench 52 could be. Preferably, the depth of the vertical trench 52 is about 10 times greater than the width. The capacitance of the metal trench de-coupling capacitor structure is proportional to the area of the sidewall of the metal trench and can be well adjusted.

Figure 5:
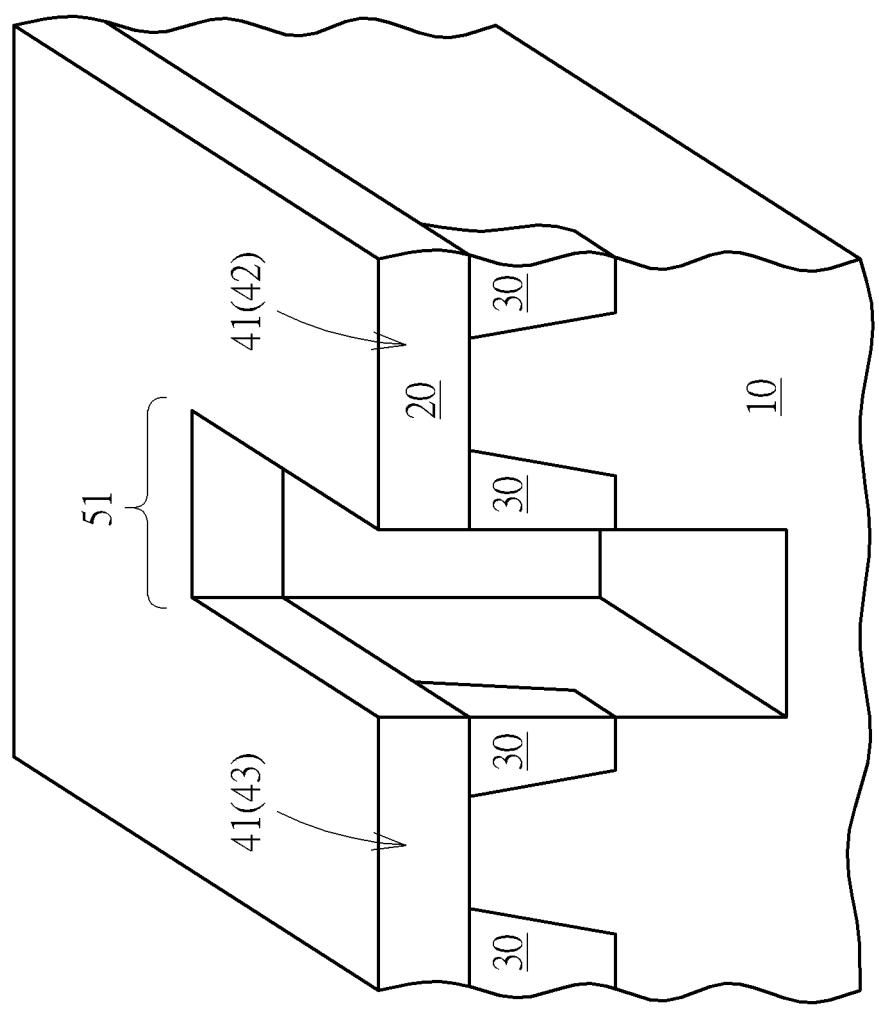
Figure 6:
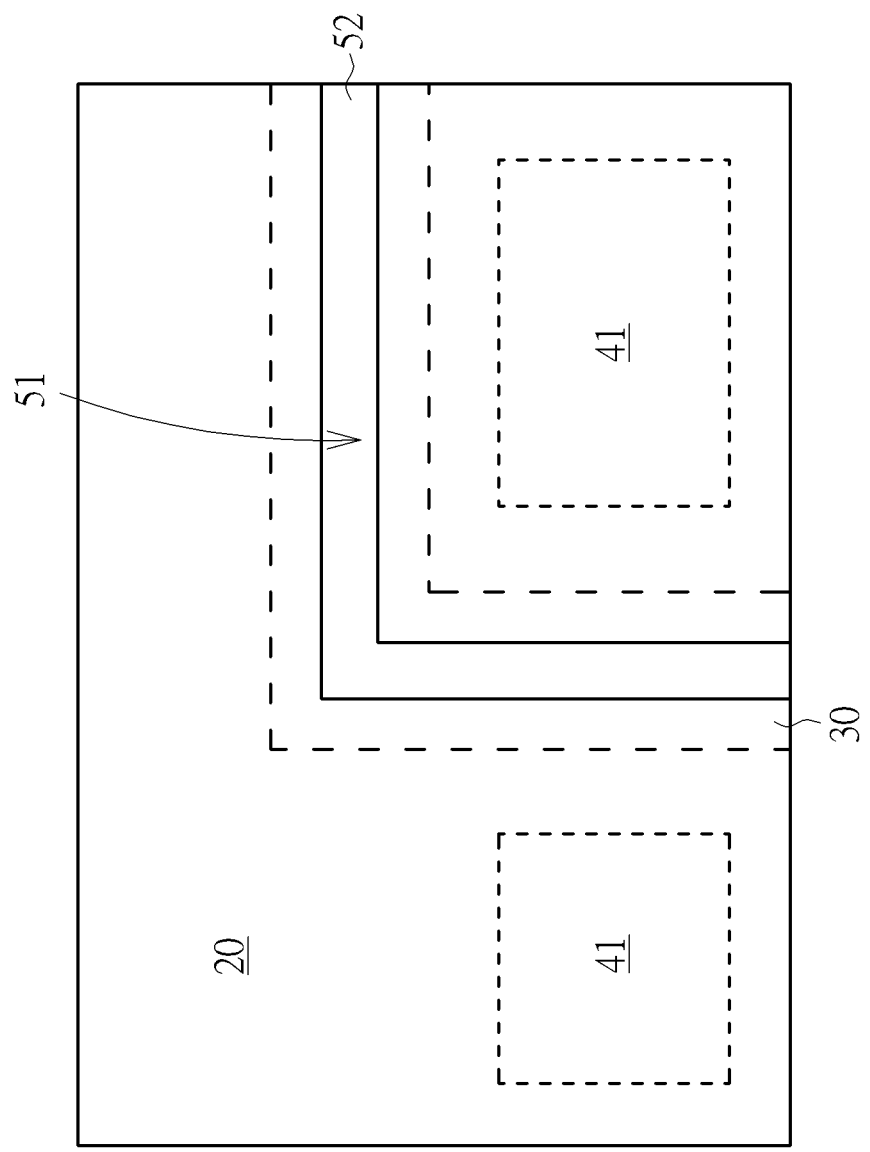

In addition, in another embodiment of the present invention, as shown in FIG. 5, the vertical trench 52 may possibly penetrate any of the shallow trench isolation 30, for example the shallow trench isolation 30 between the element regions 41, and surrounded by the shallow trench isolation 30. Preferably, there are more sensitive element regions 41 adjacent to this shallow trench isolation 30, such as a radio frequency circuit element region 43 or an analog circuit element region 44. Each element region may have individual metal trench de-coupling capacitor which is exclusively for the element region. Usually, the power of different element region comes from the same power source but in a chip each element region is independent. The metal trench de-coupling capacitor which is exclusively for the element region may be connected to different power domains by different metal connections. In another embodiment of the present invention, as shown in FIG. 6, the vertical trench 52 may conformally penetrate the shallow trench isolation 30, and is surrounded by the shallow trench isolation 30. This is effective in increasing the capacitance of the metal trench de-coupling capacitor structure.

Further, optionally, as shown in FIG. 4, the vertical trench 52 may also be disposed in a dummy element region 45 and is surrounded by a shallow trench isolation 30. Due to the current requirements of the element density of the semiconductors in the substrate 10 the higher the better, the normal element regions may not always have enough space to accommodate the metal trench de-coupling capacitor structure 50 of the present invention. Accordingly, the present invention may possibly arrange the vertical trench 52 in the dummy region 45, for example the dummy region 45 for the dummy patterns, to save the area for accommodating the semiconductor elements 40 on the substrate 10.

Figure 7:
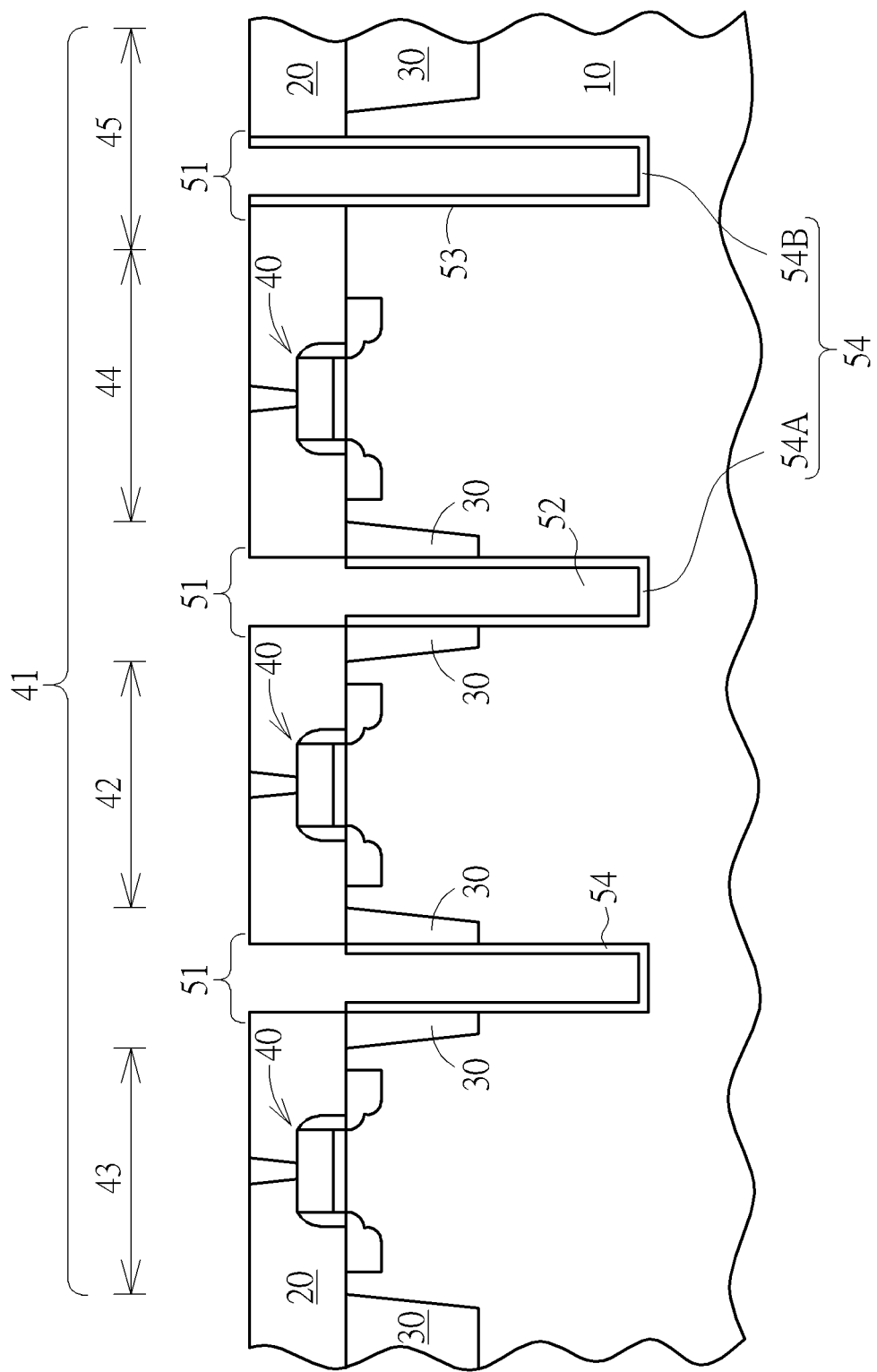

Afterwards, as shown in FIG. 7, an insulating layer 54 is formed on the inner wall 53 of the vertical trench 52. The insulating layer 54 may be any insulating material which is compatible with the substrate 10, for example silicon oxide, silicon nitride, and various high dielectric constant insulating layers, and may have different shapes due to different process. For example, optionally the silicon-containing substrate 10 may be oxidized to obtain an insulating layer 54A on the inner wall 53 of the vertical trench 52. Alternatively, a deposition method may be used, such as a plasma enhanced chemical vapor deposition (PECVD), to obtain an insulating layer 54B on the inner wall 53 of the vertical trench 52. However, both the insulating layer 54A and the insulating layer 54B are only an example of the insulating layer 54. The thickness of the insulating layer 54 may be around 10 Å~around 100 Å and may include a single layer or, the same or different composite layers. The capacitance of the metal trench de-coupling capacitor structure is inversely proportional to the thickness of the insulating layer 54 and can be well adjusted.

Figure 8:
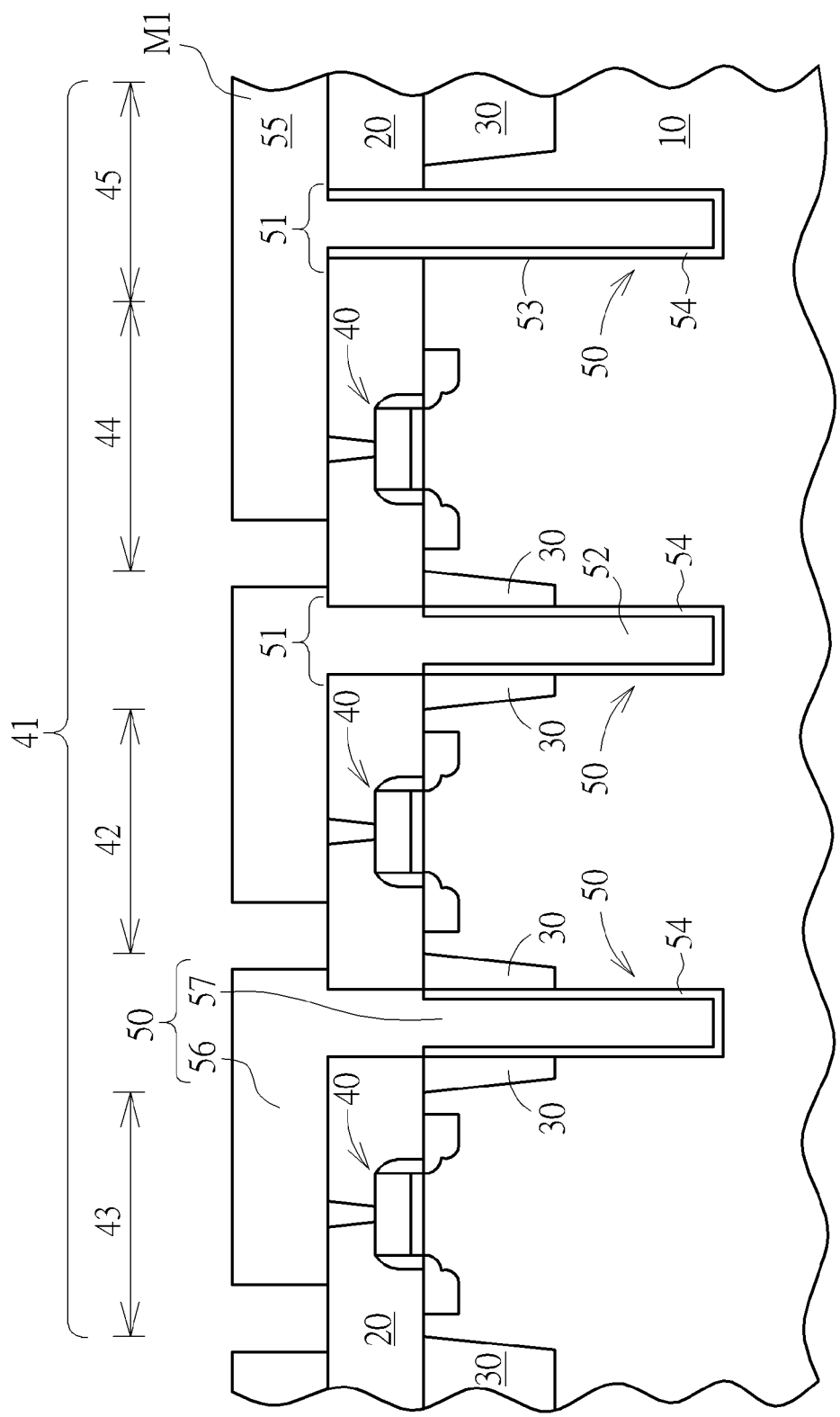
FIG. 8 illustrates the metal trench de-coupling capacitor structure and the first inter-metal connection layer is integrally formed.

Then, as shown in FIG. 8, the inter-metal connection layer 55 fills the vertical trench 52 and the damascene opening 51 at the same time so that the damascene opening 51, the vertical trench 52 and the inter-metal connection layer 55 together form a part of the metal trench de-coupling capacitor structure. The inter-metal connection layer 55 may be part of the first inter-metal connection layer (M1), and may be any metal, preferably copper, tungsten, or aluminum. The metal layer 55 may further includes a barrier, such as Ti/TiN, or Ta/TaN. The metal trench de-coupling capacitor structure 50 is the metal piles deeply in the substrate 10 to de-coup the noise to keep it from interfering with other signals from other more sensitive regions.

At this time, as shown in FIG. 8, the lateral extending portion 56 and the vertical penetrating portion 57 in the metal trench de-coupling capacitor structure 50 along with the first inter-metal connection layer (M1) may be formed at the same time, which means that the metal trench de-coupling capacitor structure 50 and the first inter-metal connection layer (M1) may be integrally formed. If the first inter-metal connection layer (M1) is not electrically connected to an external circuit, the inter-metal connection layer 55 is not electrically connected to the external circuit either, so the metal trench de-coupling capacitor structure 50 is in a floating state. If the first inter-metal connection layer (M1) is electrically connected to a power source, the inter-metal connection layer 55 is electrically connected to the power source too, so the metal trench de-coupling capacitor structure 50 is electrically connected to the power source.

Figure 9:
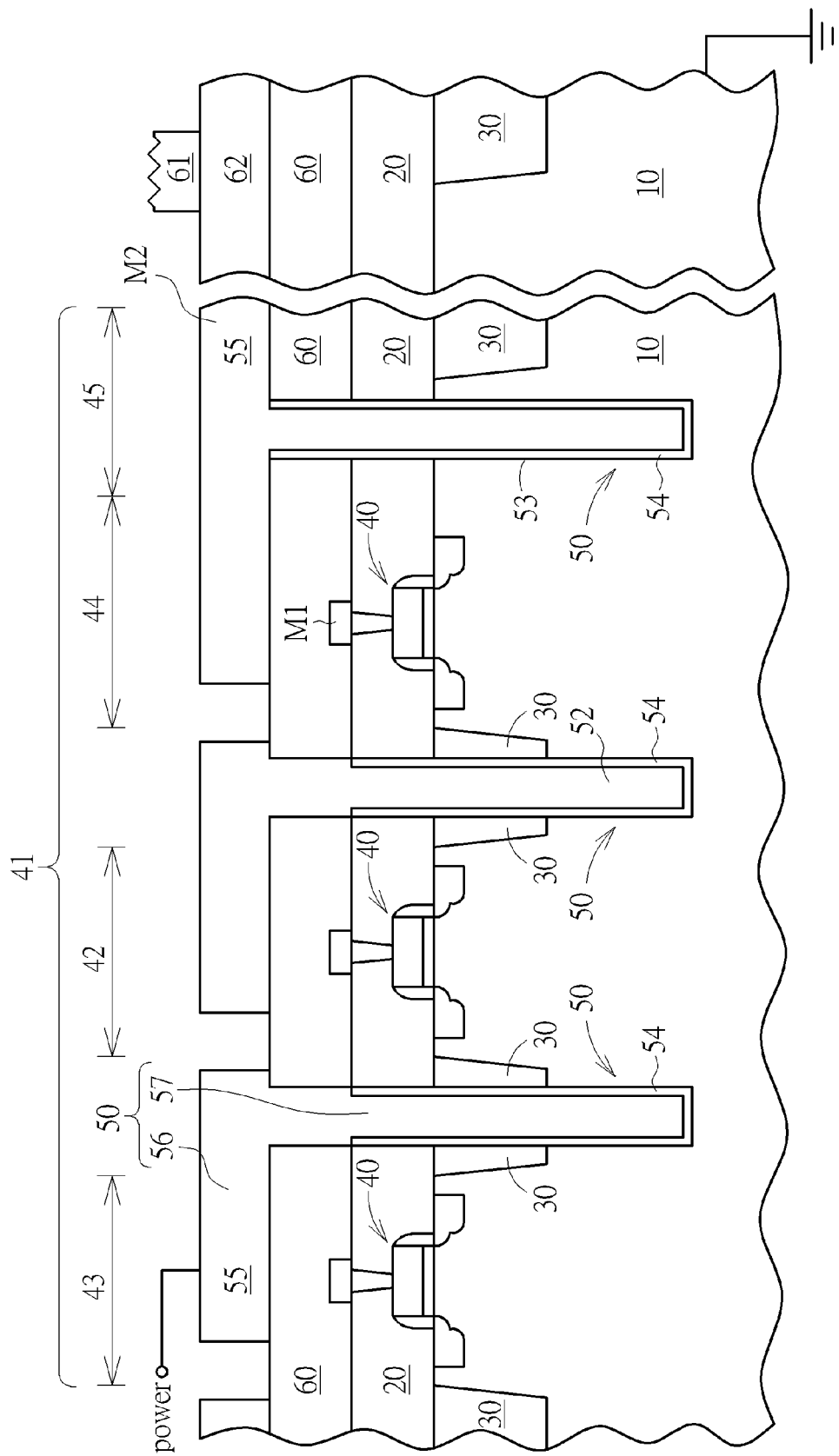
FIG. 9 illustrates the metal trench de-coupling capacitor structure and the second inter-metal connection layer is integrally formed.
Figure 10:
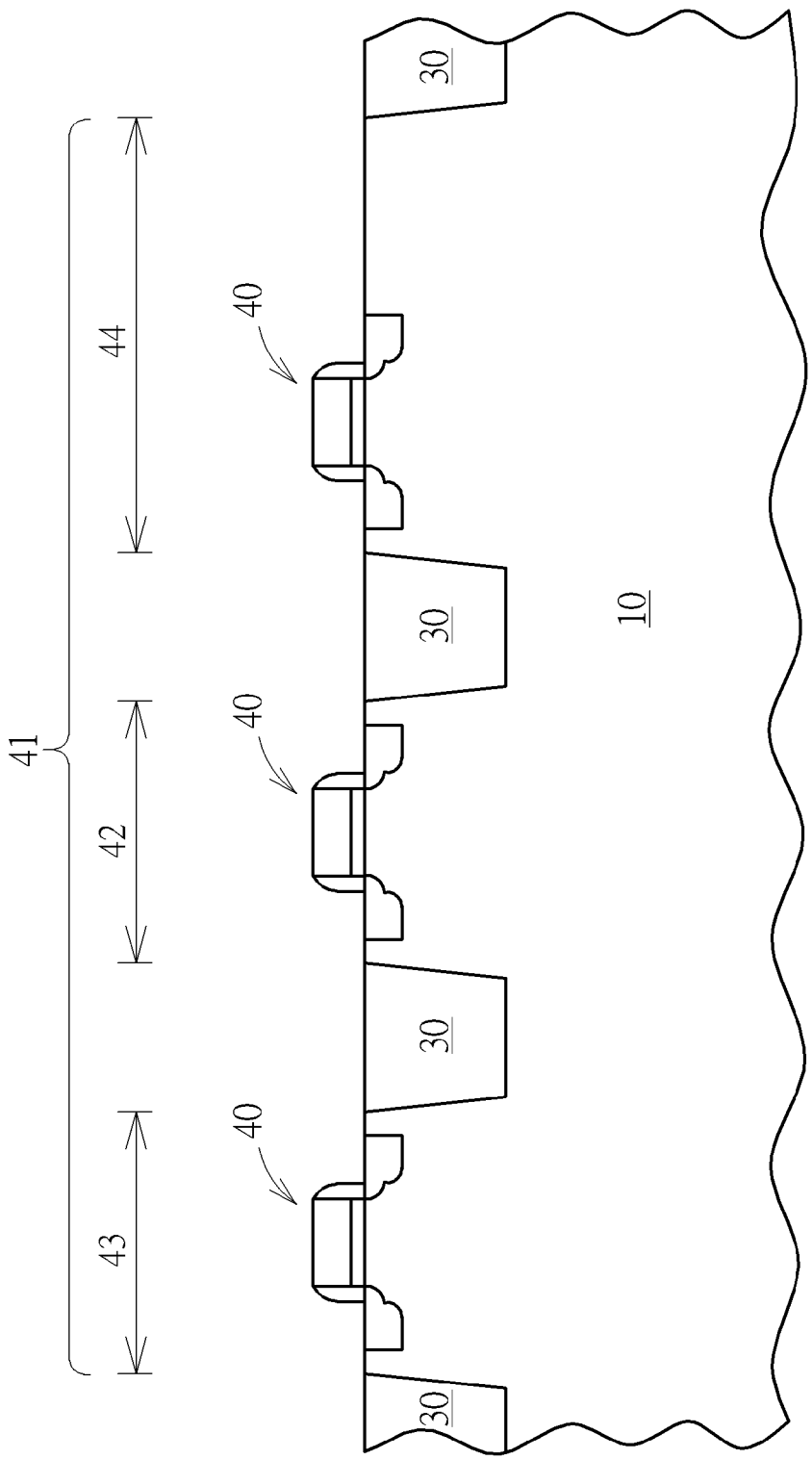
FIG. 10 illustrates semiconductor elements in prior art.

Or, as shown in FIG. 9, after the completion of the interlayer dielectric layer 20 the damascene process is not carried out or alternatively, the inter-metal dielectric layer 60 is formed on the interlayer dielectric layer 20 before the step of the damascene process between the inter-metal dielectric layer 60 and the substrate 10. At this moment, the inter-metal dielectric layer 60 is disposed on the interlayer dielectric layer 20 to cover the interlayer dielectric layer 20. The inter-metal dielectric layer 60 is usually an insulating material, such as a silicon-oxide-containing insulating material (for example, USG or FSG). In such a way, the damascene process may also form the needed damascene opening 51 and the needed vertical trench 52, so that the damascene opening 51 is disposed above the inter-metal dielectric layer 60, above the interlayer dielectric layer 20 and above the substrate 10. The vertical trench 52 penetrates the inter-metal dielectric layer 60 and the interlayer dielectric layer 20 to go into the substrate 10. Conventional methods may be used to form the damascene opening and the vertical trench. For example, a photoresist (not shown) along with a lithography process and an etching process may be used to form the damascene openings and the vertical trenches.

If the aforesaid dual damascene process is carried out in the inter-metal dielectric layer 60 and the dielectric substrate 10, the lateral extending portion 56 and the vertical penetrating portion 57 in the metal trench de-coupling capacitor structure 50 along with the second inter-metal connection layer (M2) may be formed at the same time, which means that the metal trench de-coupling capacitor structure 50 and the second inter-metal connection layer (M2) are integrally formed. The second inter-metal connection layer (M2) is usually electrically connected to a metal routing 61 or to a power source. If the second inter-metal connection layer (M2) is electrically connected to a power source, the inter-metal connection layer 55 is electrically connected to the power source too.

After the above steps, a metal trench de-coupling capacitor structure 50 is the result of the process of the present invention. Please refer to FIG. 8 or FIG. 9, the metal trench de-coupling capacitor structure 50 of the present invention includes an element region 41 disposed in the substrate 10, a vertical trench 52, an insulating layer 54, a lateral extending portion 56 and a vertical penetrating portion 57 in the inter-metal connection layer 55, and an inter-layer dielectric layer 20 disposed on the substrate 10. The substrate 10 may be a semiconductor substrate, for example a silicon substrate, an epitaxial silicon substrate, a silicon germanium substrate, a silicon carbide substrate or a silicon-on-insulator (SOI) substrate, but it is not limited to this.

The metal trench de-coupling capacitor structure 50 disposed in the substrate 10 of the present invention may be additionally surrounded by a shallow trench isolation 30. Optionally, the metal trench de-coupling capacitor structure 50 may penetrate any shallow trench isolation 30, for example penetrate the shallow trench isolation 30 between the element regions 41, and is surrounded by this shallow trench isolation 30. Preferably, there are more sensitive element regions 41 adjacent to this shallow trench isolation 30, such as a RF circuit element region 43 or an analog circuit element region 44. In another embodiment of the present invention, as shown in FIG. 6, the vertical trench 52 may conformally penetrate the shallow trench isolation 30, and is surrounded by the shallow trench isolation 30. In still another embodiment of the present invention, as shown in FIG. 9, the metal trench de-coupling capacitor structure 50 may be disposed in a dummy region 45, for example in a dummy pattern, in order to save the area of the substrate 10 and is surrounded by the shallow trench isolation 30.

The element region 41 of the present invention may include different semiconductor elements 40, so that the shallow trench isolation 30 surrounds at least one the element region 41 of the semiconductor element 40. Optionally, the element regions 41 include various electronic elements; preferably, different element regions 41 include electronic elements which generate different types of signals. For example, different element regions 41 may be a digital circuit element region 42, a RF circuit element region 43, an analog circuit element region 44 or a dummy element region 45. Because element regions 41 of different functions generate different types of voltage noise, this kind of voltage noise may interfere with one another through a mutual source connection. The metal vertical trench de-coupling capacitor structure 50 of the present invention is able to reduce the noise as much as possible.

The vertical trench 52 of the metal trench de-coupling capacitor structure 50 of the present invention goes into the substrate 10 as deep as possible. The interlayer dielectric layer 20 covers the insulating layer 54 and the substrate 10, but exposes the vertical trench 52. In one embodiment of the present invention, the vertical trench 52 is deeper than at least one semiconductor element 40 in the element region 41. For example, the vertical trench 52 is deeper than any of the semiconductor element 40 in the element region 41. Or, the depth of the vertical trench is at least greater than 5 μm. Preferably, the depth of the vertical trench may be about 30 μm-100 μm. In addition, the width of the vertical trench 52 may be about 3 μm-10 μm. Generally speaking, the depth of the vertical trench 52 is dependent upon the width of the vertical trench 52. For example, the larger the width of the vertical trench 52, the deeper of the vertical trench 52 could be. Preferably, the depth of the vertical trench 52 is about 10 times greater than the width. The capacitance of the metal trench de-coupling capacitor structure is proportional to the area of the sidewall of the metal trench and can be well adjusted.

The insulating layer 54 in the metal trench de-coupling capacitor structure 50 of the present invention serves as an insulating material between the metal layer 55 and the substrate 10. The insulating layer 54 may be any insulating material which is compatible with the substrate 10, for example silicon oxide, silicon nitride, and various high dielectric constant insulating layers, and may have different shapes due to different process. For example, as shown in FIG. 7, optionally the silicon-containing substrate 10 may be oxidized to obtain an insulating layer 54A on the inner wall 53 of the vertical trench 52. Alternatively, a deposition method may be used, such as a plasma enhanced chemical vapor deposition (PECVD), to obtain an insulating layer 54B on the inner wall 53 of the vertical trench 52. However, both the insulating layer 54A and the insulating layer 54B are only an example of the insulating layer 54. The thickness of the insulating layer 54 may be around 10 Å~around 100 Å and may include a single layer or the same or different composite layers. The capacitance of the metal trench de-coupling capacitor structure is inversely proportional to the thickness of the insulating layer 54 and can be well adjusted.

Accordingly, the inter-metal connection layer 55, the insulating layer 54 and the substrate 10 together form the metal trench capacitor structure 50 for use in de-coupling. The inter-metal connection layer 55 and the substrate 10 both electrically connected to a power source respectively serve as the upper and lower electrode of the metal trench de-coupling capacitor structure 50 and the insulating layer 54 serves as the dielectric layer of the metal trench de-coupling capacitor structure 50. Because the trench 52 is deep enough, the metal trench de-coupling capacitor structure 50 is highly capable of eliminate the interference. The inter-metal connection layer 55 may be any metal, such as Al, W or Cu. The lateral extending portion 56 and the vertical penetrating portion 57 of the metal trench de-coupling capacitor structure 50 may collectively form a T- or an L-shape.

The metal trench de-coupling capacitor structure 50 of the present invention may merely penetrate the interlayer dielectric layer 20 and the substrate 10, or further penetrate the inter-metal dielectric layer 60 on the interlayer dielectric layer 20. If the metal trench de-coupling capacitor structure 50 of the present invention merely penetrates the interlayer dielectric layer 20 and the substrate 10, as shown in FIG. 8, the inter-metal connection layer 55 in the metal trench de-coupling capacitor structure 50 and the first inter-metal connection layer (M1) are formed at the same time. In other words, the inter-metal connection layer 55 in the metal trench de-coupling capacitor structure 50 are formed integrally along with the first inter-metal connection layer (M1). If the first inter-metal connection layer (M1) is not electrically connected to an external circuit, the inter-metal connection layer 55 is not electrically connected to the external circuit either, so the metal trench de-coupling capacitor structure 50 is in a floating state. If the first inter-metal connection layer (M1) is electrically connected to a power source, the inter-metal connection layer 55 is electrically connected to the power source too, so the metal trench de-coupling capacitor structure 50 is electrically connected to the power source.

If the metal trench de-coupling capacitor structure 50 of the present invention further penetrates the inter-metal dielectric layer 60, as shown in FIG. 9, the metal trench de-coupling capacitor structure 50 and the second inter-metal connection layer (M2) may be formed at the same time, which means that the metal trench de-coupling capacitor structure 50 and the second inter-metal connection layer (M2) are integrally formed. The second inter-metal connection layer (M2) is usually electrically connected to a metal routing 61 or to a power source. If the second inter-metal connection layer (M2) is electrically connected to a power source, the inter-metal connection layer 55 is electrically connected to the power source too.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal trench de-coupling capacitor structure, comprising:
   a substrate which is grounded, comprising a shallow trench isolation;
   a vertical trench disposed in said substrate, penetrating said shallow trench isolation and partially surrounded by said shallow trench isolation;
   an insulating layer disposed on the sidewall of said vertical trench; and
   a metal connection layer comprising a lateral extending portion, disposed on said substrate and filling up said vertical trench, wherein said metal connection layer is electrically connected to a power;
   wherein said substrate further comprises at least one element region adjacent to said vertical trench so that said shallow trench isolation partially surrounds at least one said element region.

2. The metal trench de-coupling capacitor structure of claim 1, wherein at least one said element region comprises a digital circuit element region, an analog circuit element region, a dummy element region or a radio frequency circuit element region.

3. The metal trench de-coupling capacitor structure of claim 2, wherein said vertical trench is deeper than any semiconductor element in the at least one said element region.

4. The metal trench de-coupling capacitor structure of claim 2, wherein said metal connection layer decreases a power noise coming from at least one said element region by means of de-coupling.

5. The metal trench de-coupling capacitor structure of claim 1, wherein said vertical trench conformally penetrates said shallow trench isolation and is partially surrounded by said shallow trench isolation.

6. A metal trench de-coupling capacitor structure, comprising:
   a substrate which is grounded;
   a vertical trench penetrating a shallow trench isolation and disposed in said substrate;
   an insulating layer disposed on the sidewall of said vertical trench; and
   a metal connection layer comprising a lateral extending portion, disposed on said substrate, without directly contacting said shallow trench isolation and filling up said vertical trench, wherein said metal connection layer is electrically connected to a power.

7. The metal trench de-coupling capacitor structure of claim 6, wherein said substrate further comprises:
   at least one element region adjacent to said vertical trench; and
   a shallow trench isolation, to partially surround at least one said element region.

8. The metal trench de-coupling capacitor structure of claim 7, wherein at least one said element region comprises a digital circuit element region, an analog circuit element region, a dummy element region or a radio frequency circuit element region.

9. The metal trench de-coupling capacitor structure of claim 7, wherein said vertical trench is deeper than any semiconductor element in at least one said element region.

10. The metal trench de-coupling capacitor structure of claim 7, wherein said metal connection layer decreases a power noise coming from at least one said element region by means of de-coupling.

* * * * *